United States Patent
Kang

(10) Patent No.: US 7,450,442 B2
(45) Date of Patent: Nov. 11, 2008

(54) SEMICONDUCTOR MEMORY DEVICE WITH INCREASED DOMAIN CROSSING MARGIN

(75) Inventor: Sin-Deok Kang, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 279 days.

(21) Appl. No.: 11/322,281

(22) Filed: Dec. 29, 2005

(65) Prior Publication Data
US 2007/0002644 A1  Jan. 4, 2007

(30) Foreign Application Priority Data
Jun. 30, 2005  (KR) .................... 10-2005-0058479

(51) Int. Cl.
*G11C 7/00* (2006.01)
(52) U.S. Cl. ............... 365/193; 365/191; 365/233.1
(58) Field of Classification Search ................ 365/193, 365/233, 222, 230.03, 233.1; 710/167, 305
See application file for complete search history.

(56) References Cited

U.S. PATENT DOCUMENTS

| | | | |
|---|---|---|---|
| 6,839,290 B2 | 1/2005 | Ahmad et al. | |
| 7,016,256 B2 * | 3/2006 | Yoon et al. | 365/233 |
| 2003/0081713 A1 | 5/2003 | Pontius et al. | |
| 2004/0107373 A1 | 6/2004 | Ferrara | |
| 2004/0218461 A1 | 11/2004 | Park | |
| 2004/0268016 A1 * | 12/2004 | Lee et al. | 711/1 |
| 2005/0141331 A1 | 6/2005 | Cho | |

FOREIGN PATENT DOCUMENTS

| | | |
|---|---|---|
| JP | 11-328963 | 11/1999 |
| JP | 2004-327008 | 11/2004 |
| KR | 2002-0086197 | 11/2002 |

* cited by examiner

*Primary Examiner*—Richard Elms
*Assistant Examiner*—Han Yang
(74) *Attorney, Agent, or Firm*—Blakely, Sokoloff, Taylor & Zafman

(57) ABSTRACT

A semiconductor memory device with an increased domain crossing margin is provided. The semiconductor memory device includes: a data input buffer for receiving an external data in response to a driving signal; a DQS input buffer for receiving an external data strobe signal in response to the driving signal; a delay unit for delaying an output signal of the DQS input buffer by a predetermined time; a division unit for dividing an output signal of the DQS input buffer to output a plurality of internal data strobe signals; and a data align unit for aligning an output data of the delay unit in response to the corresponding internal data strobe signals to output a plurality of align data.

9 Claims, 7 Drawing Sheets

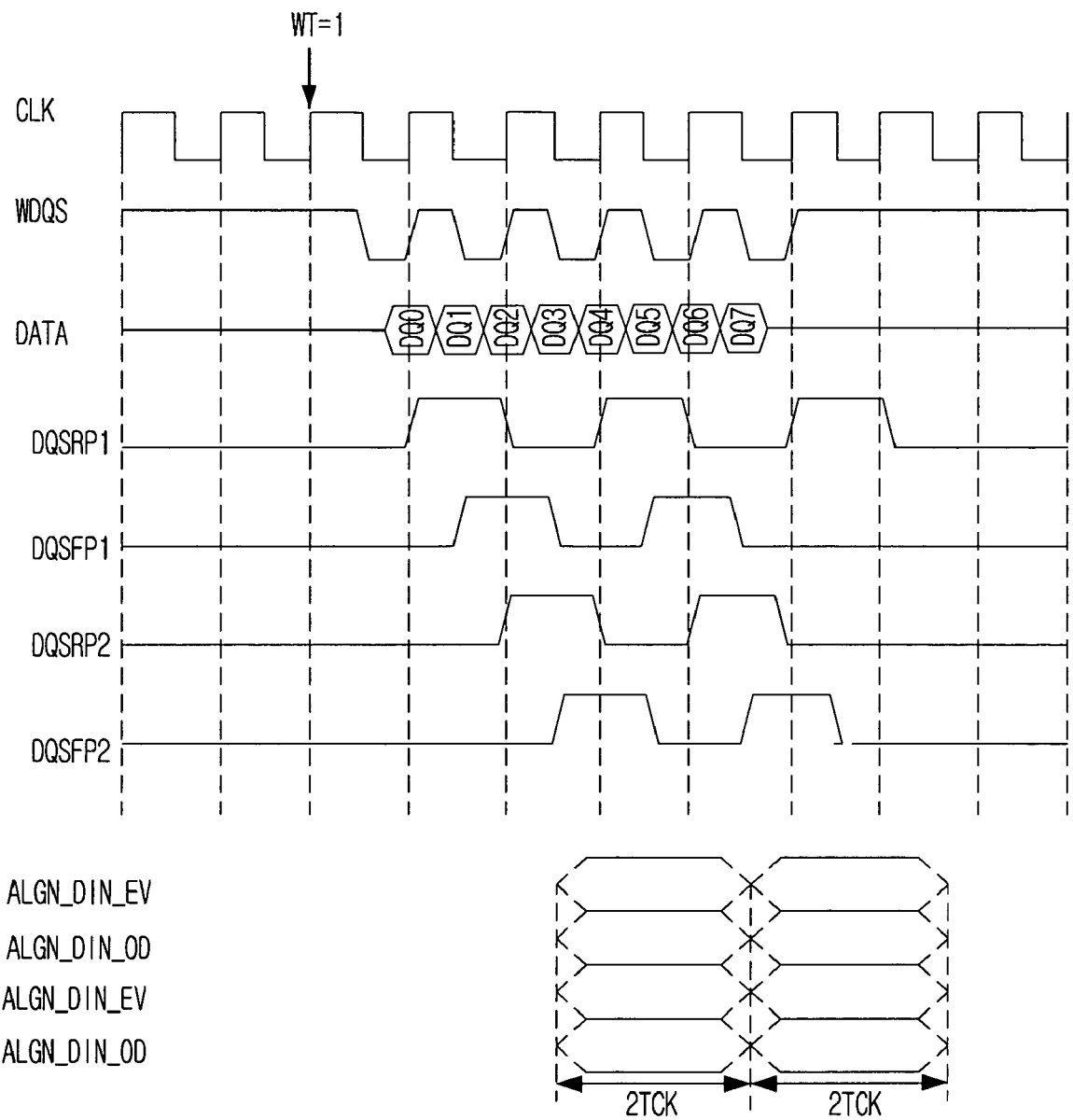

SEMICONDUCTOR MEMORY DEVICE WITH INCREASED DOMAIN CROSSING MARGIN

FIELD OF THE INVENTION

The present invention relates to a semiconductor memory device; and, more particularly, to a semiconductor memory device capable of increasing a domain crossing margin.

DESCRIPTION OF THE RELATED ART

Generally, a semiconductor memory device is driven in synchronization with specific signals, and thus is divided into a plurality of areas according to synchronization signals. Accordingly, a process of synchronizing data of a specific area with a synchronization signal of a next area is required in transferring data from the specific area to the next area. The process of transferring data from a specific area to a next area having a different synchronization signal from that of the specific area is called a "domain crossing."

A following description will be made about a process of aligning data in order for a 4-bit pre-fetch by synchronizing data with an internal clock, the data being inputted in synchronization with an external data strobe signal.

FIG. 1 is a block diagram of a structure for aligning external data in a conventional semiconductor memory device.

Referring to FIG. 1, the conventional semiconductor memory device includes: a data input buffer 10 for receiving an external data DQ in response to a driving signal ENB; a DQS input buffer 20 for receiving an external data strobe signal DQS in response to the driving signal ENB; a delay unit 30 for delaying an output signal DQ_IN of the data input buffer 10 by a predetermined time; a phase adjustment unit 40 for adjusting a phase of an output signal DQS_IN of the DQS input buffer 20 to output a falling data strobe signal FDQS and a rising data strobe signal RDQS having a phase difference of 180° from each other; and a data align unit 50 for aligning an output data DQ_IN_DL of the delay unit 30 in response to the falling data strobe signal FDQS and the rising data strobe signal RDQS to output align data ALGN_DIN_EV0, ALGN_DIN_OD0, ALGN_DIN_EV1 and ALGN_DIN_OD1.

Although not shown in FIG. 1, the conventional semiconductor memory device aligns the external data DQ inputted in synchronization with the external data strobe signal DQS and then synchronizes it with the internal clock. At this point, the domain crossing margin means a margin between the external data strobe signal DQS and the external clock. That is, an activation period of the signal synchronized with the external data strobe signal DQS has to be maintained until the internal clock is activated. Accordingly, the domain crossing margin is determined by a width of the activation period of the signal.

A process of aligning data in order for a pre-fetch by synchronizing data with the internal clock, the data being synchronized with the external data strobe signal DQS will be described below. In addition, the domain crossing margin will also be described.

FIG. 2 is a circuit diagram of the data align unit 50 illustrated in FIG. 1.

Referring to FIG. 2, the data align unit 50 includes a plurality of latches 51 to 57 connected in series and/or in parallel to latch an input data in response to the rising data strobe signal RDQS and the falling data strobe signal FDQS.

More specifically, a first latch 51 stores the output data DQ_IN_DL of the delay unit 30 in response to the rising data strobe signal RDQS, and a second latch 53 stores an output data of the first latch 51 in response to the falling data strobe signal FDQS and outputs the output data as the first align data ALGN_DIN_EV1. A third latch 52 stores an output data of the delay unit 30 in response to the falling data strobe signal FDQS and outputs the output data as the second align data ALGN_DIN_OD1. A fourth latch 54 stores the output data ALGN_DIN_EV1 of the second latch 53 in response to the rising data strobe signal RDQS. A fifth latch 55 stores the output data ALGN_DIN_OD1 of the third latch 52 in response to the rising data strobe signal RDQS. A sixth latch 56 stores an output data of the fourth latch 54 in response to the falling data strobe signal FDQS. A seventh latch 57 stores an output data of the fifth latch 55 in response to the falling data strobe signal FDQS and outputs the output data as the fourth align data ALGN_DIN_OD0.

Since the data align unit 50 latches and outputs data in response to the rising data strobe signal RDQS and the falling data strobe signal FDQS, the synchronized data are maintained during a period (1 tCK) of the data strobe signal DQS. Thus, the domain crossing margin (tDQSS) is ±0.5 tCK.

FIG. 3 is an operation waveform diagram of the signals used in the conventional semiconductor memory device when external data DQ0 to DQ7 inputted in synchronization with the external data strobe signal DQS are aligned.

Herein, it is assumed that a write latency is one clock. The write latency means a duration from an input of a write command WT to an input of an external data DQ.

Referring to FIG. 3, after the write latency of one clock from an input of the write command WT, the external data DQ0 to DQ7 are inputted in synchronization with rising edges and falling edges of the external data strobe signal DQS. Then, the DQS input buffer 20 changes the external data strobe signal DQS to have an internal voltage level. The phase adjustment unit 40 outputs the falling data strobe signal FDQS and the rising data strobe signal RDQS in synchronization with the rising edges and the falling edges of the output signal DQS_IN of the DQS input buffer 20. At this point, the falling data strobe signal FDQS and the rising data strobe signal RDQS have a phase difference of 180° from each other, but have equal periods to that of the external data strobe signal DQS.

In addition, the external data DQ0 to DQ7 are changed into the signals of the internal voltage level through the data input buffer 10 and the delay unit 30.

Then, the data align unit 50 sequentially stores the output signals DQ_IN_DL of the delay unit 30 into the internal latches 51 to 57 in synchronization with the rising data strobe signal RDQS and the falling data strobe signal FDQS. Also, the data align unit 50 simultaneously outputs the first to fourth data DQ0 to DQ3 of the external data DQ as a 4-bit align data and the fifth to eighth data DQ4 to DQ7 as a next 4-bit align data.

Since the rising data strobe signal RDQS and the falling data strobe signal FDQS are used to control the operation of the latches 51 to 57, the align data ALGN_DIN_EV0, ALGN_DIN_OD0, ALGN_DIN_EV1 and ALGN_DIN_OD1 outputted from the data align unit 50 are maintained during one period (1 tCK) of the external data strobe signal DQS.

Accordingly, in the conventional semiconductor memory device, the domain crossing margin (tDQSS) from the external data strobe signal DQS to the external clock CLK is ±1 tCK.

In practice, since the domain crossing margin (tDQSS) of the specification is ±0.25 tCK, the conventional semiconductor memory device satisfies the specification.

In the actual implementation of the semiconductor memory device, however, the margin is reduced due to the processing procedures, the driving temperature, and the voltage levels, so that it is unstable. Therefore, there is an increasing demand for a semiconductor memory device with a sufficient domain crossing margin.

SUMMARY OF THE INVENTION

It is, therefore, an object of the present invention to provide a semiconductor memory device capable of increasing a domain crossing margin (tDQSS) from an external data strobe signal to an internal clock.

In accordance with an aspect of the present invention, there is provided a semiconductor memory device, including: a data input buffer for receiving an external data in response to a driving signal; a DQS input buffer for receiving an external data strobe signal in response to the driving signal; a delay unit for delaying an output signal of the DQS input buffer by a predetermined time; a division unit for dividing an output signal of the DQS input buffer to output a plurality of internal data strobe signals; and a data align unit for aligning an output data of the delay unit in response to the corresponding internal data strobe signals to output a plurality of align data.

In accordance with another aspect of the present invention, there is provided a semiconductor memory device, including: a data input buffer for receiving an external data in response to a driving signal; a DQS input buffer for receiving an external data strobe signal in response to the driving signal; a delay unit for delaying an output signal of the data input buffer by a predetermined time; a division unit for dividing an output signal of the DQS input buffer by two to output first to fourth internal data strobe signals having a phase difference of 90° one another; and a data align unit for aligning an output data of the delay unit in response to signals corresponding to the corresponding internal data strobe signals to output a plurality of align data.

BRIEF DESCRIPTION OF THE DRAWINGS

The above and other objects and features of the present invention will become apparent from the following description of the preferred embodiments given in conjunction with the accompanying drawings, in which:

FIG. 7 is an operation waveform diagram of the semiconductor memory device illustrated in FIGS. 4 to 6.

DETAILED DESCRIPTION OF THE INVENTION

A semiconductor memory device with an increased domain crossing margin in accordance with specific embodiments of the present invention will be described in detail with reference to the accompanying drawings.

Figure 1:
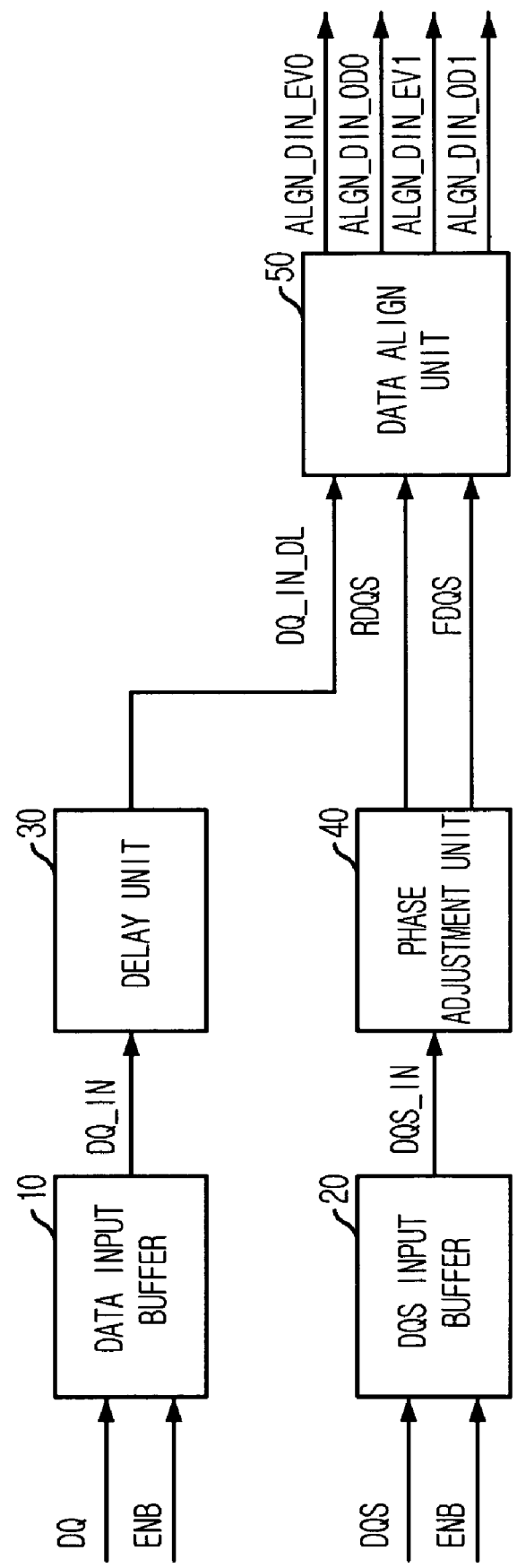
FIG. 1 is a block diagram of a structure for aligning external data in a conventional semiconductor memory device.
Figure 2:
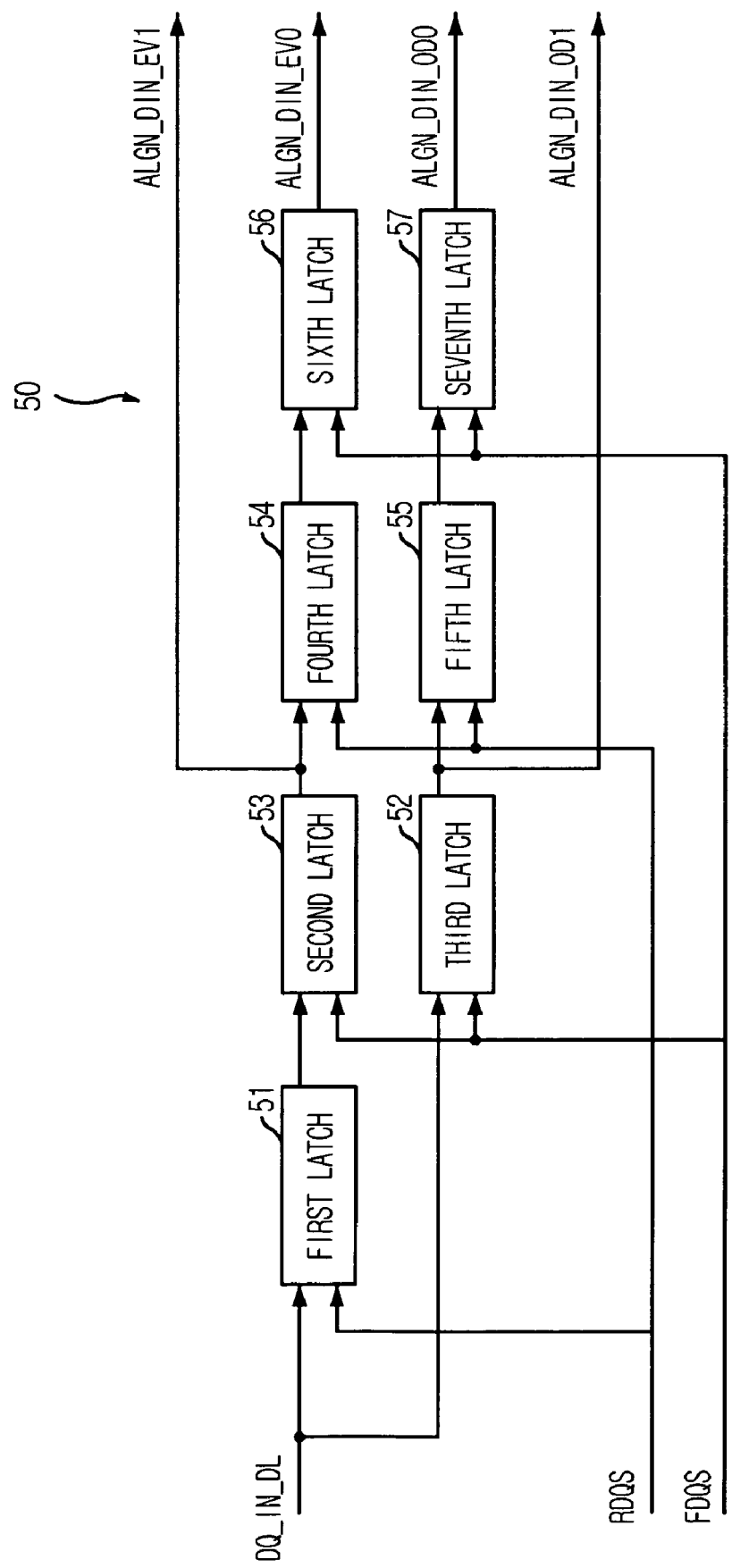
FIG. 2 is a circuit diagram of a data align unit illustrated in FIG. 1.
Figure 3:
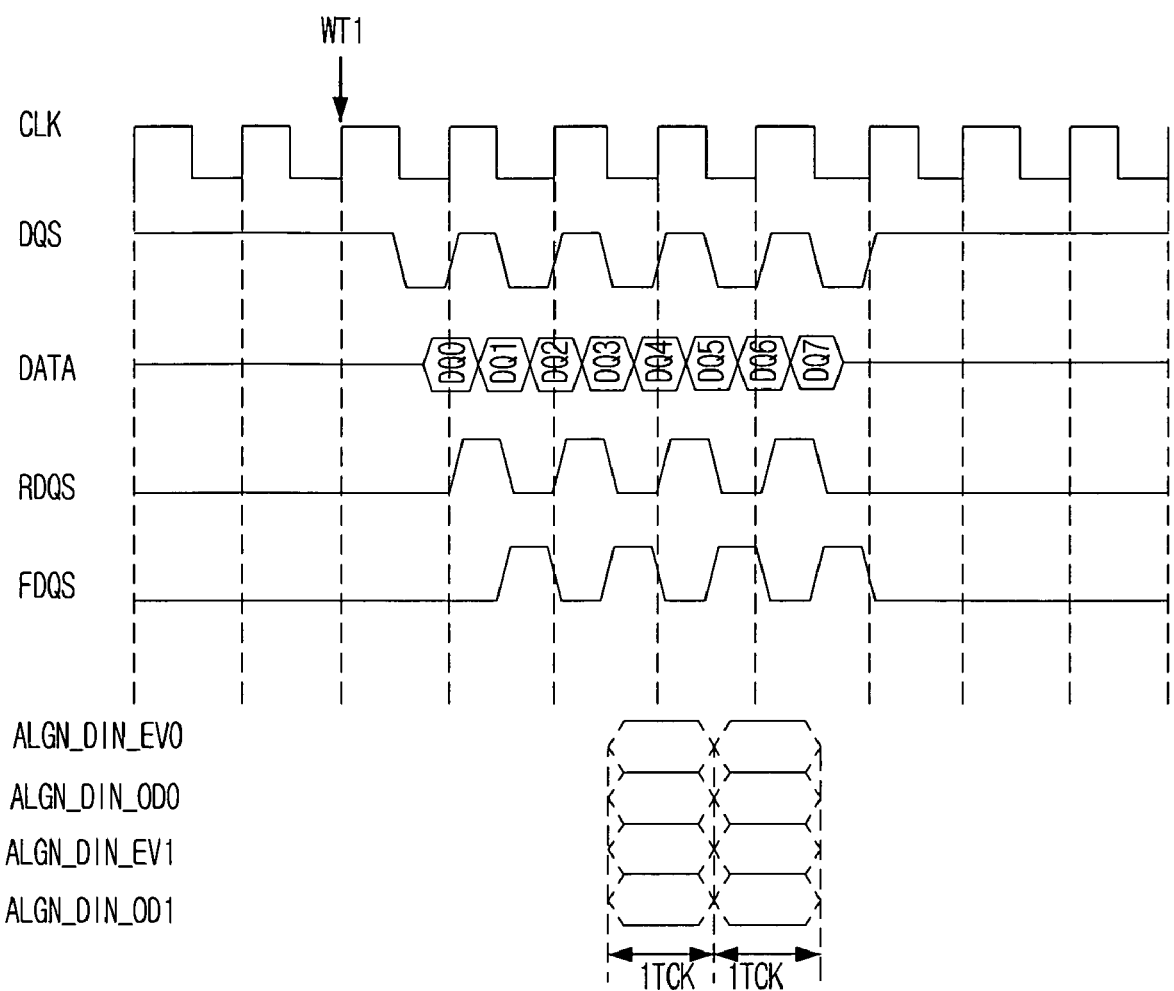
FIG. 3 is an operation waveform diagram of the conventional memory device illustrated in FIGS. 1 and 2.
Figure 4:
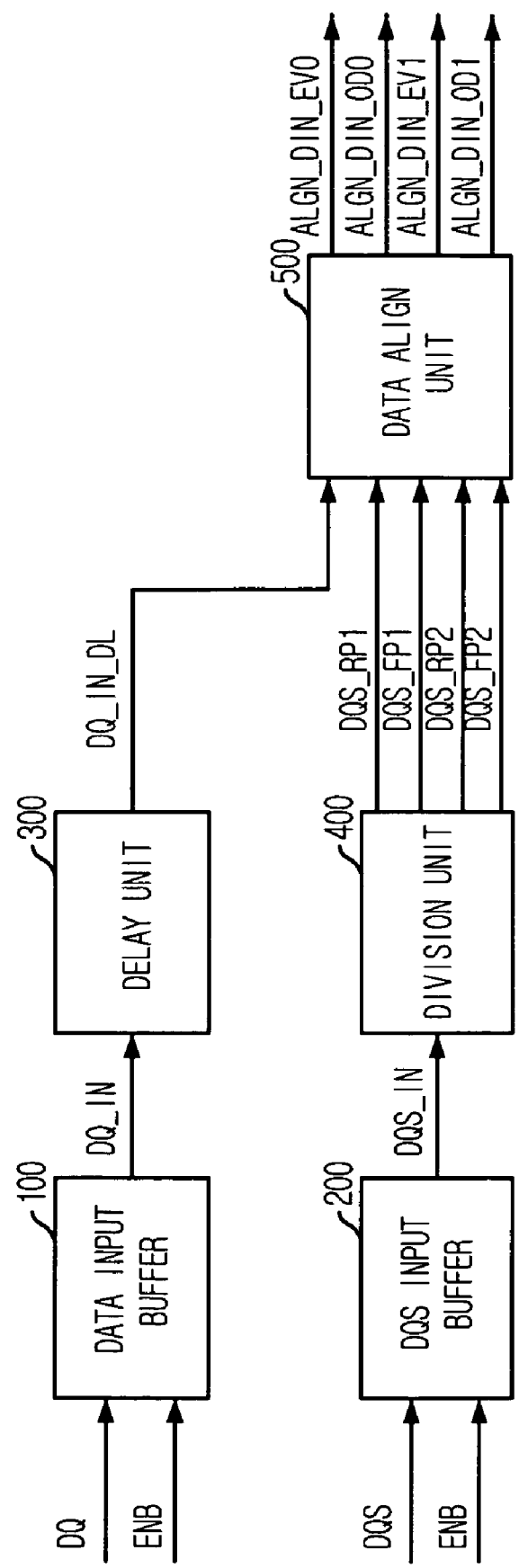
FIG. 4 is block diagram of a structure for aligning external data in a semiconductor memory device in accordance with an embodiment of the present invention.

FIG. 4 is a block diagram of a semiconductor memory device in accordance with an embodiment of the present invention.

Referring to FIG. 4, the semiconductor memory device includes a data input buffer 100 for receiving an external data DQ in response to a driving signal ENB, a DQS input buffer 200 for receiving an external data strobe signal DQS in response to the driving signal ENB, a delay unit 300 for delaying an output signal of the data input buffer 100 by a predetermined time, a division unit 400 for dividing an output signal DQS_IN of the DQS input buffer 200 to output first to fourth internal data strobe signals DQS_RP1, DQS_FP1, DQS_RP2 and DQS_FP2, and a data align unit 500 for aligning an output data DQ_IN_DL of the delay unit 300 in response to the first to fourth internal data strobe signals DQS_RP1, DQS_FP1, DQS_RP2 and DQS_FP2 to output align data ALGN_DIN_EV0, ALGN_DIN_OD0, ALGN_DIN_EV1 and ALGN_DIN_OD1.

The first to fourth internal data strobe signals DQS_RP1, DQS_FP1, DQS_RP2 and DQS_FP2 from the division unit 400 have two times period of the external data strobe signal DQS. In addition, the first to fourth internal data strobe signals DQS_RP1, DQS_FP1, DQS_RP2 and DQS_FP2 have phase difference of 90° one another.

Since periods of the first to fourth internal data strobe signals DQS_RP1, DQS_FP1, DQS_RP2 and DQS_FP2 with which the data DQ is synchronized are 2 tCK, the domain crossing margin increases to ±1 tCK.

Figure 5:
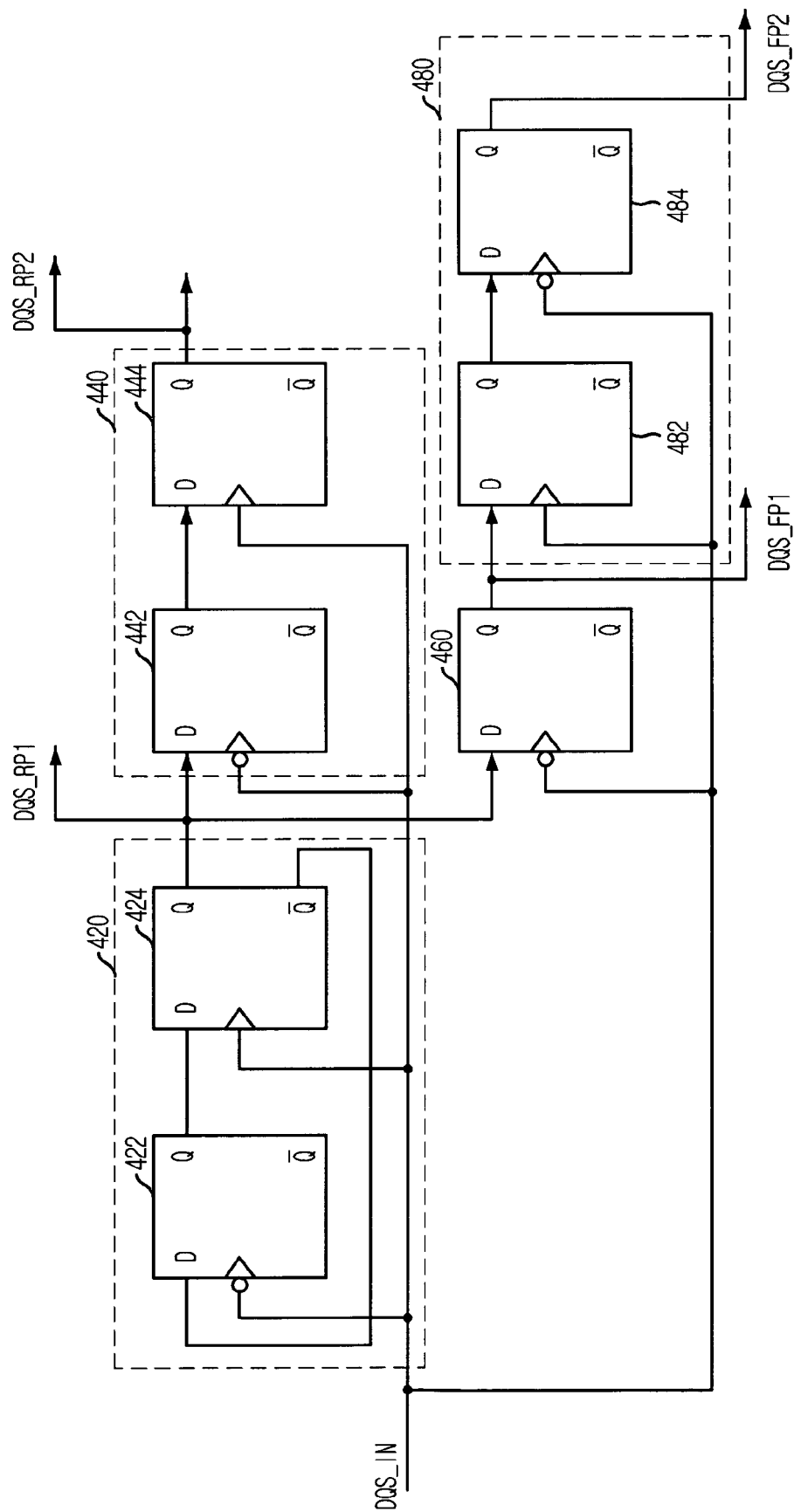
FIG. 5 is a circuit diagram of a division unit illustrated in FIG. 4.

FIG. 5 is a circuit diagram of the division unit 400 illustrated in FIG. 4.

Referring to FIG. 5, the division unit 400 includes a divider circuit 420 for dividing the output signal DQS_IN of the DQS input buffer to output the first internal data strobe signal DQS_RP1, a first delay circuit 440 for delaying the first internal strobe signal DQS_RP1 by ½ period to output the third internal data strobe signal DQS_RP2, a second delay circuit 460 for delaying the first internal data strobe signal DQS_RP1 by ¼ period to output the second internal data strobe signal DQS_FP1, and a third delay circuit 480 for delaying the second internal data strobe signal DQS_FP1 by ½ period to output the fourth internal data strobe signal DQS_FP2.

Also, the divider circuit 420 includes a first flip-flop 422 for storing a feedback signal in synchronization with a falling edge of the output signal DQS_IN of the DQS input buffer 200 and outputting the feedback signal as a positive output Q thereof, and a second flip-flop 424 for storing the Q output of the first flip-flop 422 in synchronization with a rising edge of the output signal of the DQS input buffer 200 and outputting the first internal data strobe signal DQS_RP1 as a Q output thereof and the feedback signal as a $\overline{Q}$ output thereof.

The first delay circuit 440 includes a third flip-flop 442 for storing the first internal data strobe signal DQS_RP1 in synchronization with a falling edge of the output signal DQS_IN of the DQS input buffer 200 and outputting the internal data strobe signal DQS_RP1 as a Q output thereof, and a fourth flip-flop 444 for storing the Q output of the third flip-flop 442 in synchronization with a rising edge of the output signal DQS_IN of the DQS input buffer 200 and outputting the third internal data strobe signal DQS_RP2 as a Q output thereof.

The second delay circuit 460 includes a fifth flip-flop for storing the first internal data strobe signal DQS_RP1 in synchronization with a falling edge of the output signal DQS_IN of the DQS input buffer 200 and outputting the second internal data strobe signal DQS_FP1 as a Q output thereof.

The third delay circuit 480 includes a sixth flip-flop 482 for storing the second internal data strobe signal DQS_FP1 in synchronization with a falling edge of the output signal DQS_IN of the DQS input buffer 200 and outputting the second internal data strobe signal DQS_FP1 as a Q output thereof, and a seventh flip-flop 484 for storing the Q output of the sixth flip-flop 482 in synchronization with a rising edge of the output signal DQS_IN of the DQS input buffer 200 and outputting the fourth internal data strobe signal DQS_FP2 as a Q output thereof.

An operation of the division unit 400 will be described below in brief.

First, the divider circuit 420 divides the output signal DQS_IN of the DQS input buffer 200 through the first and second flip-flops 422 and 424 to output the first internal data strobe signal DQS_RP1 having two times period of the data strobe signal DQS.

The first delay circuit 440 delays the first internal data strobe signal DQS_RP1 by ½ period to output the third internal data strobe signal DQS_RP2 having a phase difference of 180° with respect to the first internal data strobe signal DQS_RP1. Since the second delay circuit 460 delays the first internal data strobe signal DQS_RP1 by ¼ period, the second internal data strobe signal DQS_FP1 has a phase difference of 90° with respect to the first internal data strobe signal DQS_RP1. Since the fourth internal data strobe signal DQS_FP2 from the third delay circuit 480 is a signal produced by delaying the second internal data strobe signal DQS_FP1 by ½ period, it has a phase difference of 270° with respect to the first internal data strobe signal DQS_RP1.

That is, the division unit 400 generates the signal having two times period of the output signal DQS_IN of the DQS input buffer 200 through the divider circuit 420, and outputs the first to fourth internal data strobe signals DQS_RP1, DQS_FP1, DQS_RP2 and DQS_FP2 having a phase difference of 90° through the delay circuits 440, 460 and 480.

Figure 6:
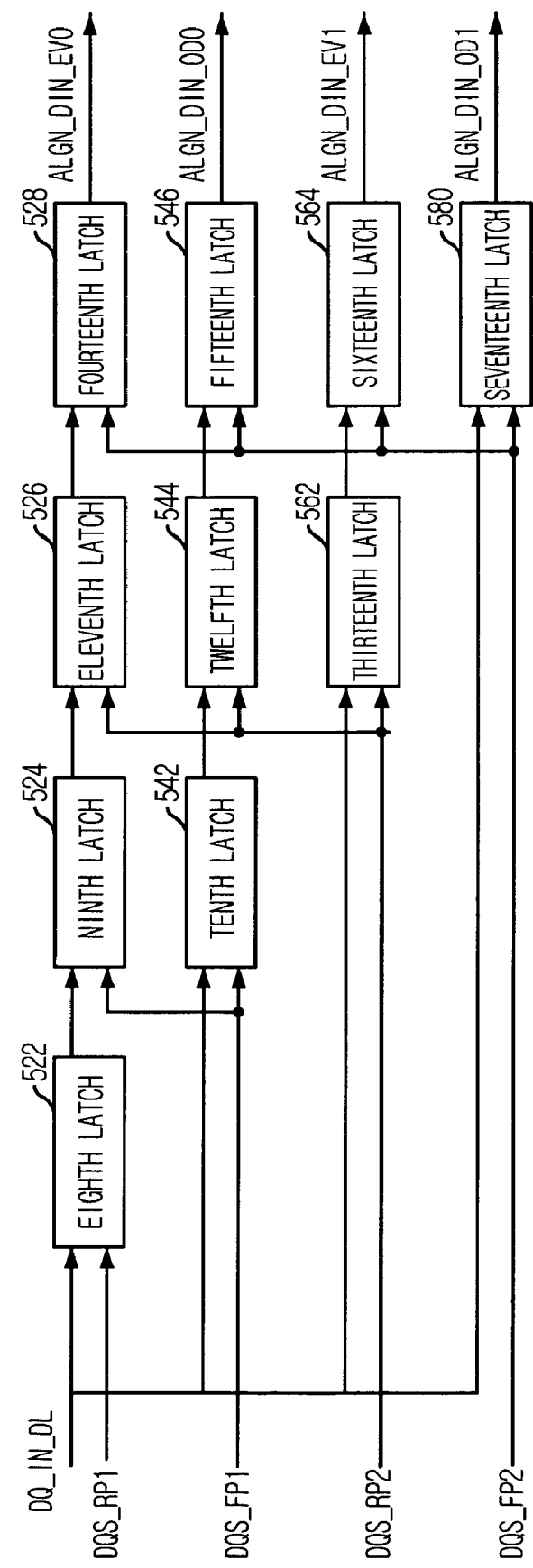
FIG. 6 is a circuit diagram of a data align unit illustrated in FIG. 4.

FIG. 6 is a circuit diagram of the data align unit 500 illustrated in FIG. 4.

Referring to FIG. 6, the data align unit 500 includes a plurality of latches connected in series to store data in synchronization with the first to fourth internal data strobe signals DQS_RP1, DQS_FP1, DQS_RP2 and DQS_FP2. The serially connected latches are connected in parallel in four rows and align data inputted in synchronization with the rising and falling edges of the external data strobe signal DQS in units of 4 bits.

More specifically, the data align unit 500 includes an eighth latch 522 for storing the output signal DQ_IN_DL of the delay unit 300 in synchronization with the first internal data strobe signal DQS_RP1, a ninth latch 524 for storing an output signal of the eighth latch 522 in synchronization with the second internal data strobe signal DQS_FP1, a tenth latch 542 for storing the output signal DQ_IN_DL of the delay unit 300 in synchronization with the second internal data strobe signal DQS_FP1, an eleventh latch 526 for storing an output of the ninth latch 524 in synchronization with the third internal data strobe signal DQS_RP2, a twelfth latch 544 for storing an output signal of the tenth latch 542 in synchronization with the third internal data strobe signal DQS_RP2, a thirteenth latch 562 for storing an output signal DQ_IN_DL of the delay unit 300 in synchronization with the third internal data strobe signal DQS_RP2, a fourteenth latch 528 for storing an output signal of the eleventh latch 526 in synchronization with the fourth internal data strobe signal DQS_FP2 and outputting the first align data ALGN_DIN_EV0, a fifteenth latch 546 for storing an output signal of the twelfth latch 544 in synchronization with the fourth internal data strobe signal DQS_FP2 and outputting the second align data ALGN_DIN_OD0, a sixteenth latch 564 for storing an output signal of the thirteenth latch 562 in synchronization with the fourth internal data strobe signal DQS_FP2 and outputting the third align data ALGN_DIN_EV1, and a seventeenth latch 580 for storing the output signal DQ_IN_DL of the delay unit 300 in synchronization with the fourth data strobe signal DQS_FP2 and outputting the fourth align data ALGN_DIN_OD1.

Accordingly, the first and fourth align data ALGN_DIN_EV0, ALGN_DIN_OD0, ALGN_DIN_EV1 and ALGN_DIN_OD1 are synchronized with the first to fourth internal data strobe signals DQS_RP1, DQS_FP1, DQS_RP2 and DQS_FP2 having two times period of the external data strobe signal DQS and phase difference of 90° one another, and are maintained during two times period of the external data strobe signal DQS. The data inputted in synchronization with the rising and falling edges of the external data strobe signal DQS are aligned and outputted in units of 4 bits by the data align unit 500.

FIG. 7 is an operation waveform diagram of the signals used in the semiconductor memory device of the present invention when the external data are aligned and outputted in units of 4 bits. Herein, it is assumed that a write latency is one clock.

Referring to FIG. 7, after the write latency from an input of the write command WT, the external data DQ0 to DQ7 are inputted in synchronization with rising edges and falling edges of the external data strobe signal DQS.

Then, the DQS input buffer 200 synchronizes the external data strobe signal DQS with the internal clock CLK and changes the external data strobe signal DQS to have an internal voltage level. The division unit 400 outputs the first to fourth internal data strobe signals DQS_RP1, DQS_RP2, DQS_FP1 and DQS_FP2 having two times period of the output signal DQS_IN of the DQS input buffer 200 and phase difference of 90° one another.

In addition, the external data DQ are changed into the signals of the internal voltage level through the data input buffer 100 and the delay unit 300.

Then, the data align unit 300 sequentially stores the output signal DQ_IN_DL of the delay unit 300 into the latches in synchronization with the first to fourth data strobe signals DQS_RP1, DQS_RP2, DQS_FP1 and DQS_FP2. Also, the data align unit 300 simultaneously outputs the first to fourth data DQ0 to DQ4 of the external data DQ as a 4-bit align data and the fifth to eighth data DQ5 to DQ8 as a next 4-bit align data.

Specifically, since the first to fourth internal data strobe signals DQS_RP1, DQS_FP1, DQS_RP2 and DQS_FP2 are used to control the operation of the latches, the align data ALGN_DIN_EV0, ALGN_DIN_OD0, ALGN_DIN_EV1 and ALGN_DIN_OD1 outputted from the data align unit 500 are maintained during two periods (2 tCK) of the external data strobe signal DQS.

Accordingly, in the semiconductor memory device of the present invention, the domain crossing margin (tDQSS) from the external data strobe signal DQS to the internal clock CLK is ±0.1 tCK.

Therefore, the semiconductor memory device in accordance with the specific embodiment of the present invention aligns the data using the signals having two times period of the external data strobe signal and thus extends the activation period of the data. Consequently, the domain crossing margin (tDQSS) from the external data strobe signal to the internal clock becomes ±0.1 tCK. That is, compared with the prior art, the domain crossing margin increases by two times.

In accordance with the specific embodiment of the present invention, the increased domain crossing margin supports a stable operation of the semiconductor memory device even when a processing, a driving voltage, and a temperature are changed, to thereby improve the reliability of the semiconductor memory device.

Although the first to fourth internal data strobe signals having two times period of the external data strobe signal are used in the above embodiments, it is apparent to those skilled in the art that internal data strobe signals having various times period of the external data strobe signal can also be used.

In addition, although the 4-bit pre-fetch has been described above, the present invention is not limited to the number of data bits aligned for the pre-fetch.

The present application contains subject matter related to the Korean patent application No. KR 2005-0058479, filed in the Korean Patent Office on Jun. 30, 2005, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A semiconductor memory device, comprising:
   a data input buffer for receiving an external data in response to a driving signal;
   a DQS input buffer for receiving an external data strobe signal in response to the driving signal;
   a delay unit for delaying an output signal of the DQS input buffer by a predetermined time;
   a division unit for dividing an output signal of the DQS input buffer by two to output a plurality of internal data strobe signals; and
   a data align unit for receiving output data from the delay unit and the internal data strobe signals from the division unit, and aligning the received output data of the delay unit in response to the corresponding internal data strobe signals to output a plurality of align data,
   wherein the plurality of internal data strobe signals are first to fourth internal data strobe signals having two times the period of the output signal of the DQS input buffer and a phase difference of 90° of each other.

2. The semiconductor memory device of claim 1, wherein the division unit includes:
   a divider circuit for dividing the output signal of the DQS input buffer to output a first internal data strobe signal;
   a first delay circuit for delaying the first internal data strobe signal by ½ period to output a third internal data strobe signal;
   a second delay circuit for delaying the first internal data strobe signal by ¼ period to output a second internal data strobe signal; and
   a third delay unit for delaying the second internal data strobe signal by ½ period to output a fourth internal data strobe signal.

3. The semiconductor memory device of claim 2, wherein the divider circuit includes:
   a first flip-flop for storing a feedback signal in synchronization with a falling edge of the output signal of the DQS input buffer and outputting the feedback signal as a Q output thereof; and
   a second flip-flop for storing the Q output of the first flip-flop in synchronization with a rising edge of the output signal of the DQS input buffer and outputting the first internal data strobe signal as a Q output thereof and the feedback signal as a $\overline{Q}$ output thereof.

4. The semiconductor memory device of claim 3, wherein the first delay circuit includes:

a third flip-flop for storing the first internal data strobe signal in synchronization with the falling edge of the output signal of the DQS input buffer and outputting the first internal data strobe signal as a Q output thereof; and
   a fourth flip-flop for storing the Q output of the third flip-flop in synchronization with the rising edge of the output signal of the DQS input buffer and outputting the third internal data strobe signal as a Q output thereof.

5. The semiconductor memory device of claim 4, wherein the second delay circuit includes a fifth flip-flop for storing the first internal data strobe signal in synchronization with the falling edge of the output signal of the DQS input buffer and outputting the second internal data strobe signal as a Q output thereof.

6. The semiconductor memory device of claim 5, wherein the third delay circuit includes:
   a sixth flip-flop for storing the second internal data strobe signal in synchronization with the falling edge of the output signal of the DQS input buffer and outputting the second internal data strobe signal as a Q output thereof; and
   a seventh flip-flop for storing the Q output of the sixth flip-flop in synchronization with the rising edge of the output signal of the DQS input buffer and outputting the fourth internal data strobe signal as a Q output thereof.

7. The semiconductor memory device of claim 6, wherein the data align unit includes a plurality of latches driven in synchronization with the first to fourth internal data strobe signals to maintain the first to fourth align data during two times period of the external data strobe signal.

8. The semiconductor memory device of claim 1, wherein the data align unit includes a plurality of latches driven in synchronization with the first to fourth internal data strobe signals to maintain the first to fourth align data during two times period of the external data strobe signal.

9. The semiconductor memory device of claim 8, wherein the data align unit includes:
   a first latch for storing the output signal of the delay unit in synchronization with the first internal data strobe signal;
   a second latch for storing an output signal of the first latch in synchronization with the second internal data strobe signal;
   a third latch for storing the output signal of the delay unit in synchronization with the second internal data strobe signal;
   a fourth latch for storing an output of the third latch in synchronization with the third internal data strobe signal;
   a fifth latch for storing an output signal of the second latch in synchronization with the third internal data strobe signal;
   a sixth latch for storing the output signal of the delay unit in synchronization with the third internal data strobe signal;
   a seventh latch for storing an output signal of the fourth latch in synchronization with the fourth internal data strobe signal and outputting a first align data;
   an eighth latch for storing an output signal of the fifth latch in synchronization with the fourth internal data strobe signal and outputting a second align data;
   a ninth latch for storing an output signal of the sixth latch in synchronization with the fourth internal data strobe signal and outputting a third align data; and
   a tenth latch for storing the output signal of the delay unit in synchronization with the fourth data strobe signal and outputting a fourth align data.

* * * * *